United States Patent
Lim (10) Patent No.: US 8,134,155 B2
(45) Date of Patent: Mar. 13, 2012

(54) LIQUID CRYSTAL DISPLAY DEVICE CAPABLE OF REDUCING LEAKAGE CURRENT, AND FABRICATION METHOD THEREOF

(75) Inventor: Byoung-Ho Lim, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/474,356

(22) Filed: Jun. 26, 2006

(65) Prior Publication Data

US 2006/0289867 A1   Dec. 28, 2006

(30) Foreign Application Priority Data

Jun. 27, 2005   (KR) .................. 10-2005-0055963

(51) Int. Cl.
*H01L 29/04* (2006.01)
(52) U.S. Cl. ................ 257/72; 257/59; 257/66
(58) Field of Classification Search .............. 257/59, 257/72

See application file for complete search history.

(56) References Cited

U.S. PATENT DOCUMENTS

| | | | |
|---|---|---|---|
| 6,303,946 B1 | 10/2001 | Sung | |
| 6,833,882 B2 * | 12/2004 | Lee | 349/43 |
| 6,858,867 B2 * | 2/2005 | Okumura | 257/59 |
| 6,897,482 B2 * | 5/2005 | Morita et al. | 257/72 |
| 6,919,942 B2 | 7/2005 | Aoki et al. | |
| 2005/0104128 A1 * | 5/2005 | Okumura | 257/354 |

FOREIGN PATENT DOCUMENTS

| | | |
|---|---|---|
| JP | 8-116062 | 5/1996 |
| JP | 2002-190605 | 7/2002 |
| JP | 2003-273365 | 9/2003 |

* cited by examiner

*Primary Examiner* — Ori Nadav
(74) *Attorney, Agent, or Firm* — McKenna Long & Aldridge LLP

(57) ABSTRACT

The present invention discloses a liquid crystal display device which can improve quality of image by reducing a leakage current by a backlight, and a fabrication method thereof. The liquid crystal display device includes: a substrate; a plurality of gate lines aligned on the substrate in a direction; gate electrodes connected to the gate lines; a plurality of data lines for defining a plurality of pixels by vertically crossing the gate lines; source electrodes and drain electrodes formed on the gate electrodes and separated from the data lines with a predetermined gap; pixel electrodes formed in the pixel regions and electrically connected to the drain electrodes; connecting patterns for electrically connecting the data lines to the source electrodes; and semiconductor layers disposed between the gate electrodes and the source/drain electrodes.

3 Claims, 9 Drawing Sheets

LIQUID CRYSTAL DISPLAY DEVICE CAPABLE OF REDUCING LEAKAGE CURRENT, AND FABRICATION METHOD THEREOF

This application claims the benefit of Korean Patent Application No. 10-2005-55963, filed on Jun. 27, 2005, which is hereby incorporated by reference for all purposes as if fully set forth herein.

BACKGROUND OF THE INVENTION

1. Field of the Invention

The present invention relates to a liquid crystal display device, and more particularly, to a liquid crystal display device that may improve image quality by reducing a leakage current in a backlight and a fabrication method thereof.

2. Description of the Background Art

In the case of a display device, especially a flat panel display such as a liquid crystal display device, active devices such as thin film transistors (TFT) are formed in each pixel to drive the display device. Normally, this driving method of the display device is called an active matrix driving method. In the active driving method, the active devices are disposed in the pixels aligned in a matrix respectively, for driving the pixels.

Figure 1:
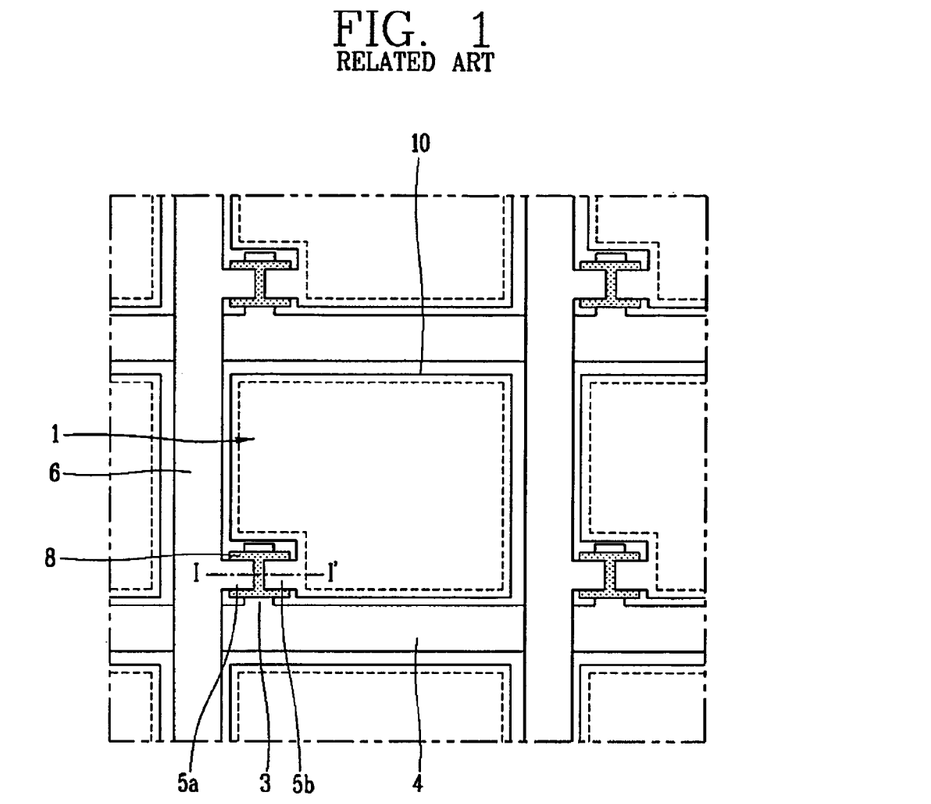
FIG. 1 is a schematic plan diagram illustrating a related liquid crystal display device.

FIG. 1 is a plan diagram illustrating an active matrix type liquid crystal display device. Referring to FIG. 1, the liquid crystal display device is a TFT LCD using TFTs as active devices. N×N pixels are vertically and horizontally disposed in the TFT LCD. In each pixel of the TFT LCD, the TFT is formed at the crossing of a gate line 4 receiving a scan signal from an external driving circuit and a data line 6 receiving an image signal. The TFT includes a gate electrode 3 connected to the gate line 4, a semiconductor layer 8 formed on the gate electrode 3 and activated when the scan signal is applied to the gate electrode 3, and source/drain electrodes 5a and 5b formed on the semiconductor layer 8. A pixel electrode 10 is connected to the source/drain electrodes 5a and 5b receives the image signal through the source/drain electrodes 5a and 5b by activation of the semiconductor layer 8, and drives liquid crystals (not shown) that are formed in the display region of the pixel 1.

Figure 2:
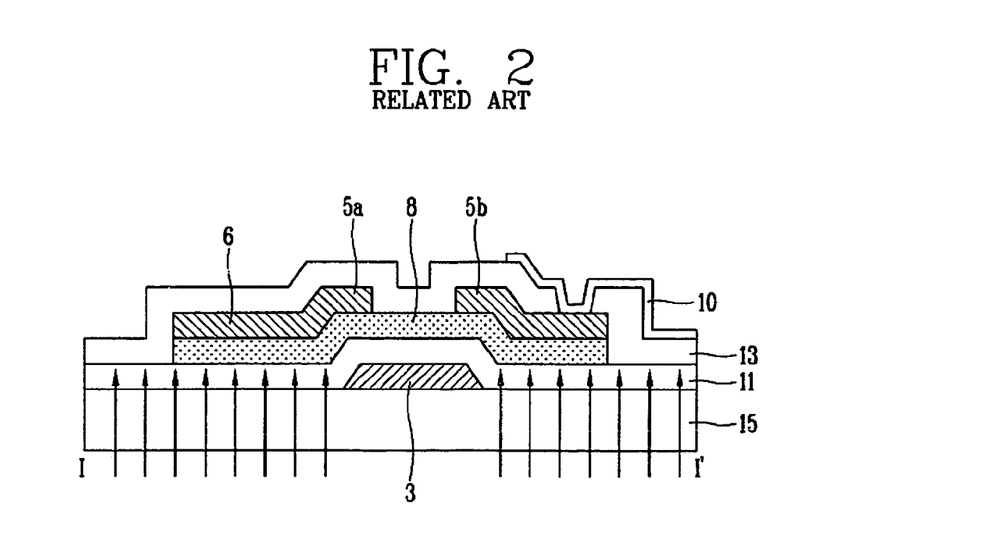
FIG. 2 is a cross-sectional diagram taken along line I-I' of FIG. 1.

FIG. 2 is a cross-sectional diagram illustrating the structure of the TFT disposed in each pixel. As shown in FIG. 2, the TFT includes the gate electrode 3 formed on a substrate 15 made of a transparent insulator such as glass, a gate insulating layer 11 stacked on the whole surface of the substrate 15 on which the gate electrode 3 has been formed, the semiconductor layer 8 formed on the gate insulating layer 11 and activated when a signal is applied to the gate electrode 3, the source/drain electrodes 5a and 5b formed on the semiconductor layer 8, and a passivation layer 13 formed on the source/drain electrodes 5a and 5b, for protecting the device. Here, the drain electrode 5b of the TFT is electrically connected to the pixel electrode 10 formed in the pixel. Therefore, when the signal is applied to the pixel electrode 10 through the source/drain electrodes 5a and 5b, the pixel electrode 10 drives the liquid crystals to display images.

On the other hand, in a 4-mask process, the semiconductor layer 8 and the source/drain electrodes 5a and 5b are formed by the same mask process. The source/drain electrodes 5a and 5b are formed to correspond to the semiconductor layer 8.

However, in the related TFT structure, light (indicated by arrows) of a backlight is incident on the semiconductor layer 8 and may activate the semiconductor layer 8 that increases a leakage current. As a result, the related art liquid crystal display device has reduced image quality by generating an afterimage on the screen due to the increased leakage current caused by light of the backlight.

SUMMARY OF THE INVENTION

Accordingly, the present invention is directed to a liquid crystal display device capable of reducing leakage current of the TFTs, and a fabrication method thereof that substantially obviates one or more of the problems due to limitations and disadvantages of the related art.

An advantage of the present invention is to provide a liquid crystal display device that can improve image quality by reducing a leakage current of the TFTs and a fabrication method thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a liquid crystal display device, including: first and second substrates; a plurality of gate lines aligned on the first substrate in a first direction; gate electrodes that extend from the gate lines; a plurality of data lines substantially perpendicular to the gate lines that define a plurality of pixel regions; source electrodes and drain electrodes over the gate electrodes and separated from the data lines by a predetermined gap; pixel electrodes in the pixel regions and electrically connected to the drain electrodes; connecting patterns that electrically connect the data lines to the source electrodes; semiconductor layers disposed between the gate electrodes and the source/drain electrodes; and a liquid crystal layer between the first and second substrates.

In another aspect of the present invention, A fabrication method of a liquid crystal display device, comprising: preparing a first substrate and a second substrate; forming a plurality of gate lines aligned on the first substrate in a first direction and a plurality of gate electrodes; forming a plurality of data lines substantially perpendicular to the gate lines that define a plurality of pixel regions and source electrodes and drain electrodes separated from the data lines by a predetermined gap; forming pixel electrodes electrically connected to the drain electrodes in the pixel regions and connecting patterns that electrically connect the data lines to the source electrodes; and forming a liquid crystal layer between the first and second substrates.

In another aspect of the present invention, A fabrication method of a liquid crystal display device, comprising: preparing a first substrate and a second substrate; forming a plurality of gate lines aligned on the first substrate in a first direction and a plurality of gate electrodes; forming pixel electrodes and connecting patterns on the first substrate; forming, on the first substrate, a plurality of data lines substantially perpendicular to the gate lines for defining a plurality of pixel regions, source electrodes contacting the data lines through the connecting patterns, and drain electrodes contacting the pixel electrodes, the source/drain electrodes being separated from the data lines by a predetermined gap; and forming a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3b is a cross-sectional diagram taken along line II-II' of FIG. 3a;

FIG. 4b is a cross-sectional diagram taken along line III-III' of FIG. 4a;

DETAILED DESCRIPTION OF THE ILLUSTRATED EMBODIMENTS

Reference will now be made in detail to the embodiments of the present invention, examples of which are illustrated in the accompanying drawings.

A liquid crystal display device capable of reducing a leakage current and a fabrication method thereof in accordance with the present invention will now be described in detail with reference to the accompanying drawings.

Figure 3A:
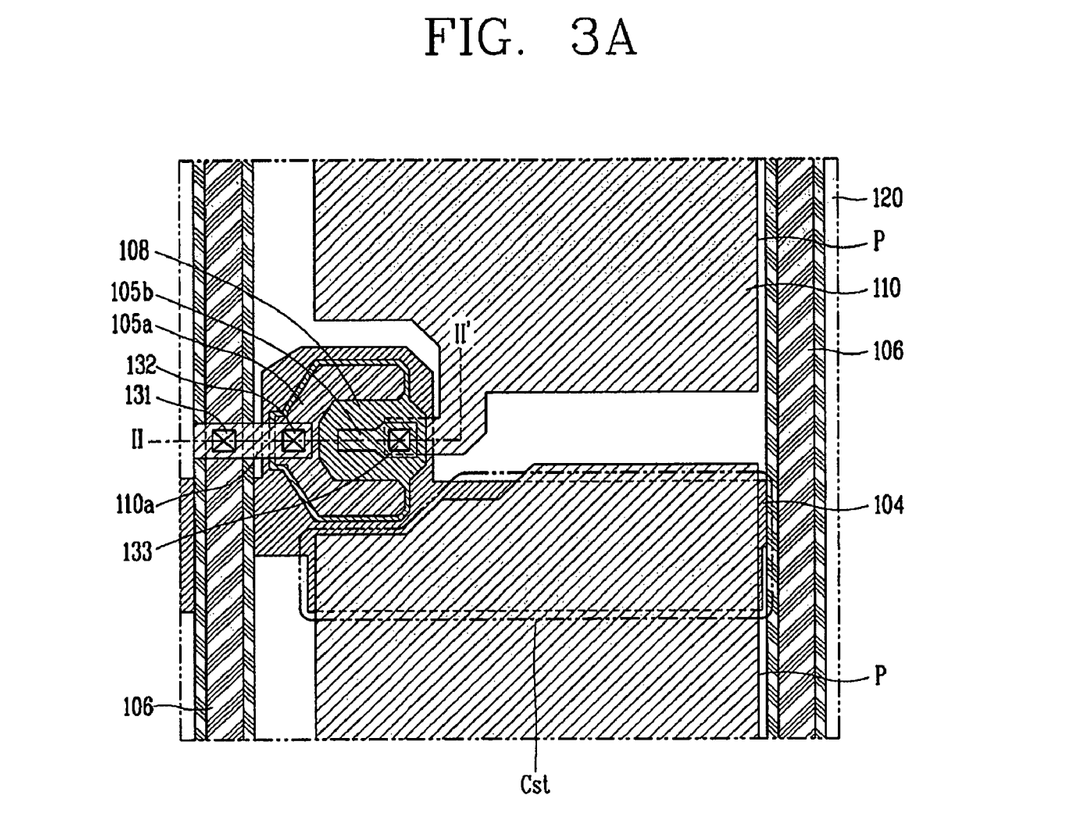
FIG. 3a is a plan diagram illustrating a liquid crystal display device in accordance with a first embodiment of the present invention.
Figure 3B:
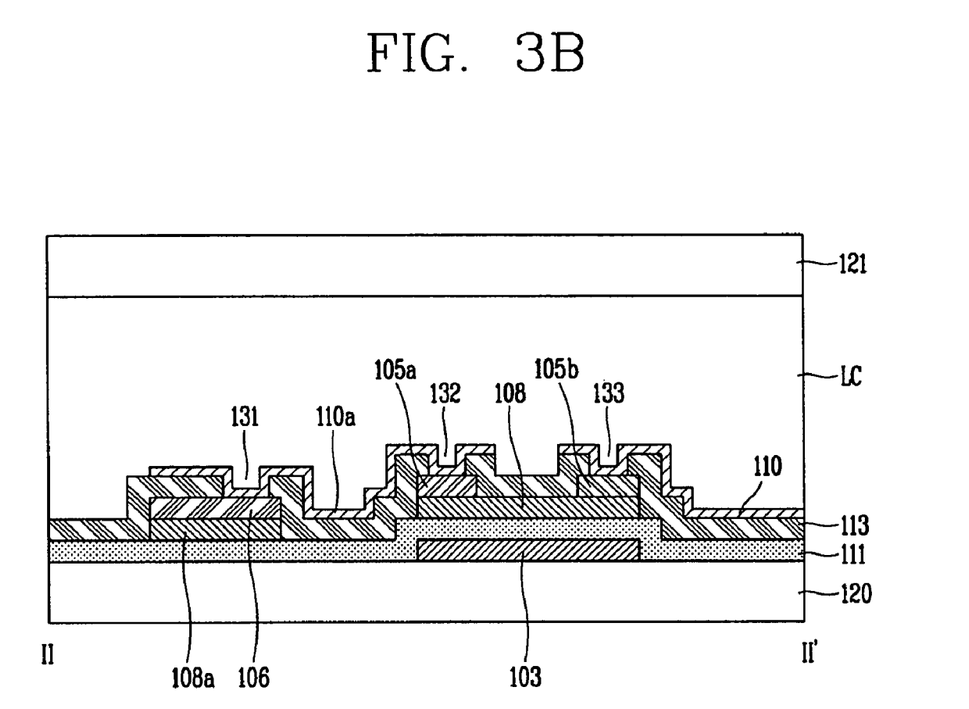

FIGS. 3a and 3b illustrate a liquid crystal display device in accordance with a first embodiment of the present invention. FIG. 3a is a plan diagram illustrating part of pixels adjacent to a gate line, and FIG. 3b is a cross-sectional diagram taken along line II-II' of FIG. 3a.

As illustrated in FIGS. 3a and 3b, the liquid crystal display device 100 includes an upper substrate 121, a lower transparent substrate 120 and a liquid crystal layer LC therebetween. A plurality of gate lines 104 are aligned on the transparent lower substrate 120 in a first direction, a plurality of data lines 106 are aligned in a second direction substantially perpendicular to the gate lines 104, that define a plurality of pixels P, and TFTs are formed at the crossings of the gate lines 104 and the data lines 106. Here, each TFT includes a gate electrode 103 extending out from the gate line 104, a semiconductor layer 108 formed on the gate electrode 103 and isolated from a semiconductor pattern 108a formed at the lower portion of the data line 106, and source/drain electrodes 105a and 105b formed on the semiconductor layer 108 to correspond to the gate electrode 103.

A gate insulating film 111 is disposed between the gate electrode 103 and the semiconductor layer 108. A passivation layer 113 is formed on the lower substrate 120 including the data line 106 and the source/drain electrodes 105a and 105b.

A pixel electrode 110 electrically contacting the drain electrode 105b through a drain contact hole 133 is formed in the pixel region P. The source electrode 105a is electrically connected to the data line 106 through a connecting pattern 110a. The connecting pattern 110a connects the data line 106 to the source electrode 105a through a first contact hole 131 formed on the data line 106 and a second contact hole 132 formed on the source electrode 105a, respectively.

The pixel electrode 110 is extended so as to overlap the gate line 104 to form a storage capacitor Cst with the gate line 104. In addition, the pixel electrode 110 and the connecting pattern 110a are formed on the passivation layer 113.

As described above, in the liquid crystal display device, the semiconductor patterns 108a formed at the lower portions of the data lines 106 and the semiconductor layers 108 of the TFTs are isolated from each other to prevent a leakage current by the backlight.

Generally, in the liquid crystal display device fabricated by the 4-mask process, the semiconductor patterns are formed at the lower portions of the data lines, and the source electrodes of the TFTs are extended from the data lines to the upper portions of the semiconductor layers. Therefore, the semiconductor patterns are formed along the source electrodes and incorporated with the semiconductor layers. As a result, the semiconductor patterns are formed between the data lines and the semiconductor layers and exposed to light from the backlight, thereby generating the leakage current (refer to FIG. 2).

Conversely, in accordance with the present invention, the semiconductor patterns formed between the data lines 106 and the semiconductor layers 108 are removed to prevent the leakage current from being generated by the backlight. The data lines 106 and the source electrodes 105a are electrically connected to each other by the connecting patterns 110a. Especially, the semiconductor layers 108 and the source and drain electrodes 105a and 105b are formed within the regions of the gate electrodes 103 to completely intercept light of the backlight by the gate electrodes 103.

Thus, the leakage current is not generated by the semiconductor patterns exposed to light of the backlight. Although the semiconductor patterns are formed to correspond to the data lines, the semiconductor patterns are isolated from the semiconductor layers and do not generate the leakage current in the TFTs.

The liquid crystal display device may be fabricated by the 4-mask process. That is, the gate electrodes and the gate lines are formed by a first mask process, and the semiconductor layers, the source and drain electrodes and the data lines are formed by a second mask process. A diffraction mask (or halftone mask) is used in the second mask process. The contact holes (drain contact holes, etc.) are formed by a third mask process, and the pixel electrodes are formed by a fourth mask process.

Figure 4A:
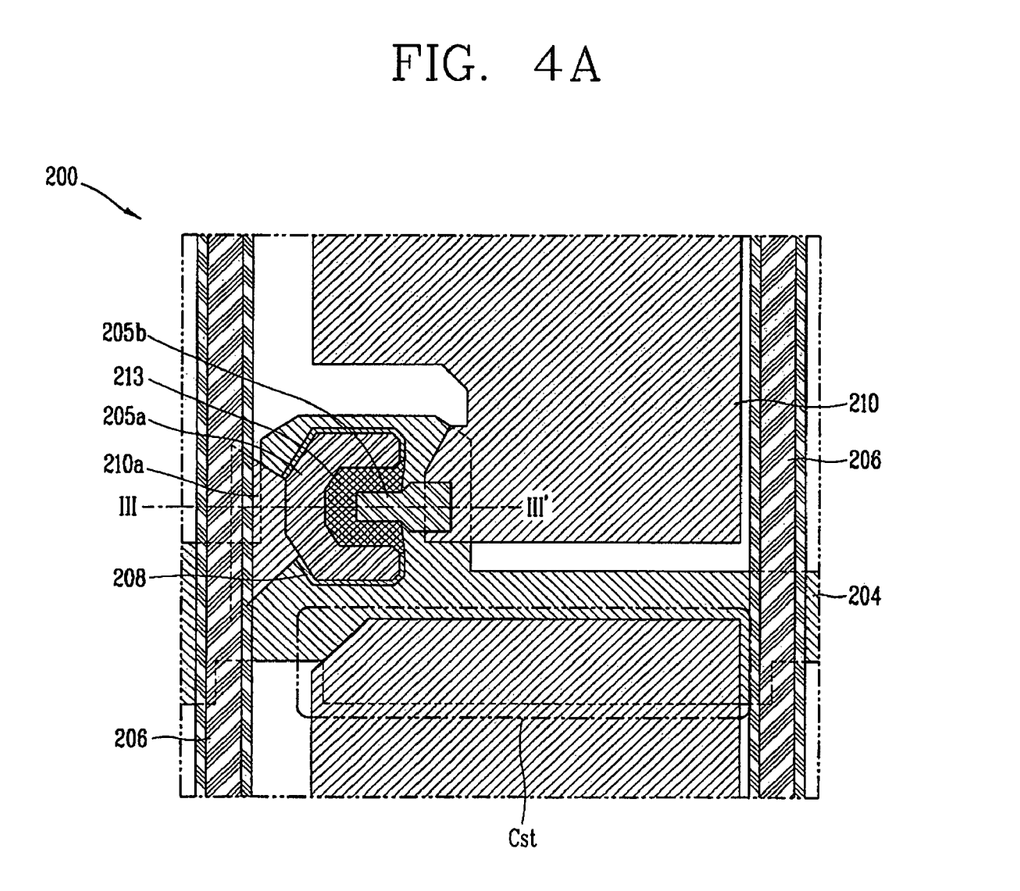
FIG. 4a is a plan diagram illustrating a liquid crystal display device in accordance with a second embodiment of the present invention.
Figure 4B:
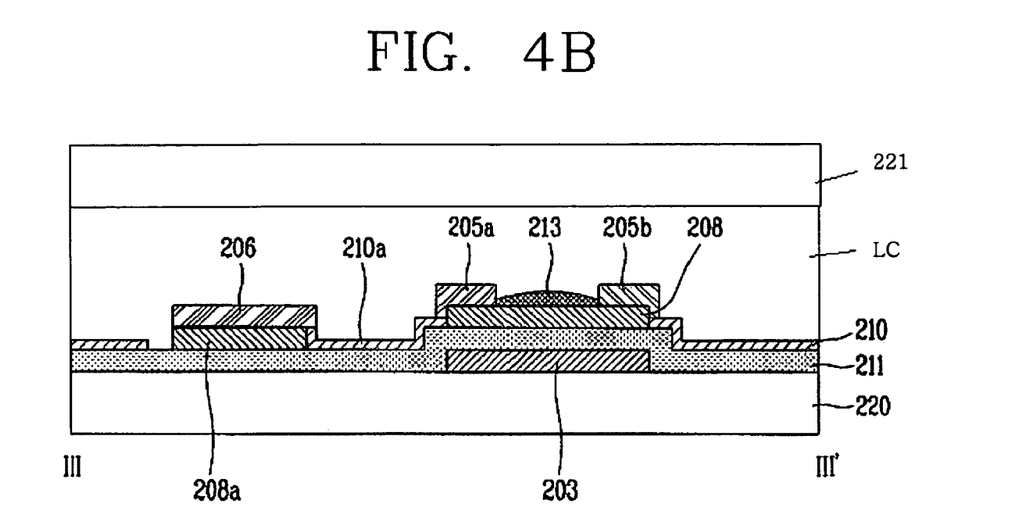

On the other hand, the liquid crystal display device may also be fabricated by a 3-mask process. FIGS. 4a and 4b illustrate the liquid crystal display device fabricated by the 3-mask process. FIG. 4a is a plan diagram and FIG. 4b is a cross-sectional diagram taken along line III-III' of FIG. 4a.

The whole structure of the liquid crystal display device of FIGS. 4a and 4b is identical to that of the liquid crystal display device of FIGS. 3a and 3b except for the position of the pixel electrodes. The structural difference will now be explained.

As depicted in FIGS. 4a and 4b, a source electrode 205a and a data line 206 are formed with a predetermined gap therebetween, and electrically connected to each other through a connecting pattern 210a. One side of the connecting pattern 210a contacts one side of the data line 206, and the other side thereof contacts one side of the source electrode 205a, thereby electrically connecting the data line 206 to the source electrode 205a. The source electrode 205a is formed in a U shape to form a U-shaped channel, thereby increasing the switching speed of the TFT. A pixel electrode 210 contacting the drain electrode 205b of the TFT is formed in the pixel region P defined by the gate lines 204 and the data lines 206. Part of the pixel electrode 210 also contacts one side of the drain electrode 205b.

On the other hand, a gate insulating film 211 is formed on the gate electrode 203, and the connecting pattern 210a and the pixel electrode 210 are formed on the gate insulating film 211. A passivation layer 213 made of $SiO_x$ is formed on the semiconductor layer exposed between the source electrode 205a and the drain electrode 205b. The passivation layer 213 may be formed on the whole surface of the lower substrate 220 including the source and drain electrodes 205a and 205b. However, when the passivation layer 213 is formed on the whole surface of the lower substrate 220, a pad unit (not shown) for connection with a driving circuit must be exposed. Therefore, the number of the mask processes increases. However, the passivation layer 213 may be formed merely on the exposed semiconductor layer by $O_2$ plasma without adding the mask process.

The fabrication method of the liquid crystal display device using the 3-mask process will now be described in detail with reference to the accompanying drawings.

Figure 5A:
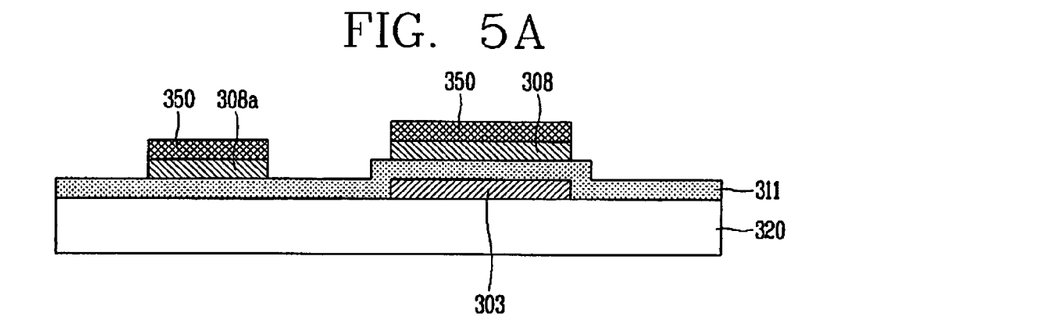
FIGS. 5a to 5d are cross-sectional diagrams illustrating a fabrication method of a liquid crystal display device in accordance with the present invention.
Figure 5B:
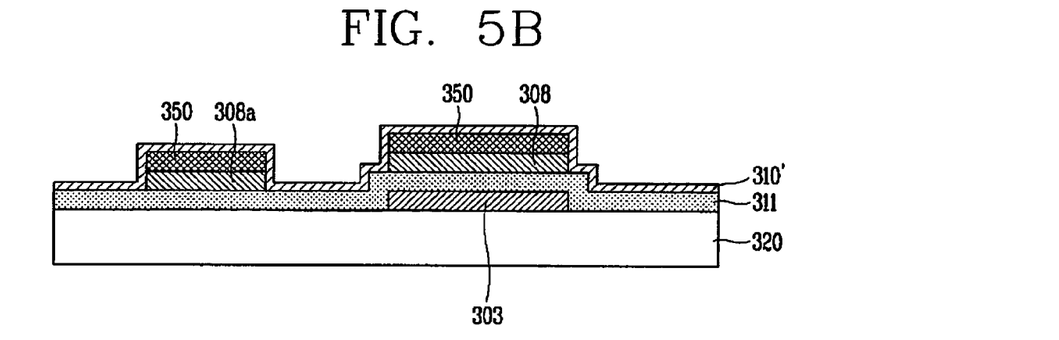
Figure 5C:
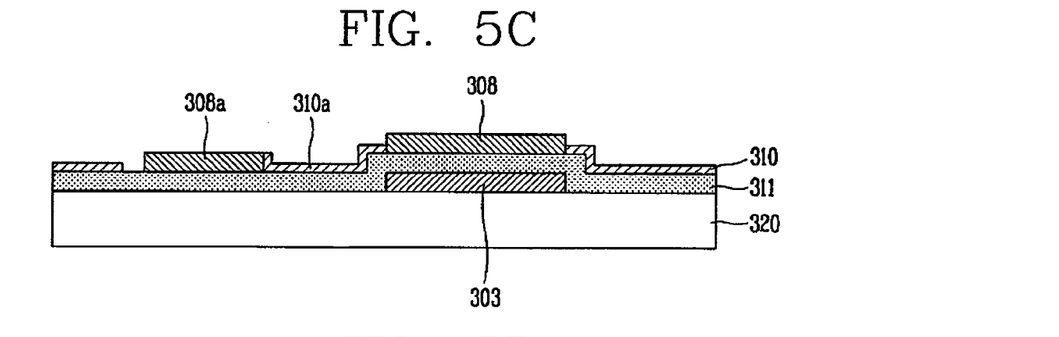
Figure 5D:
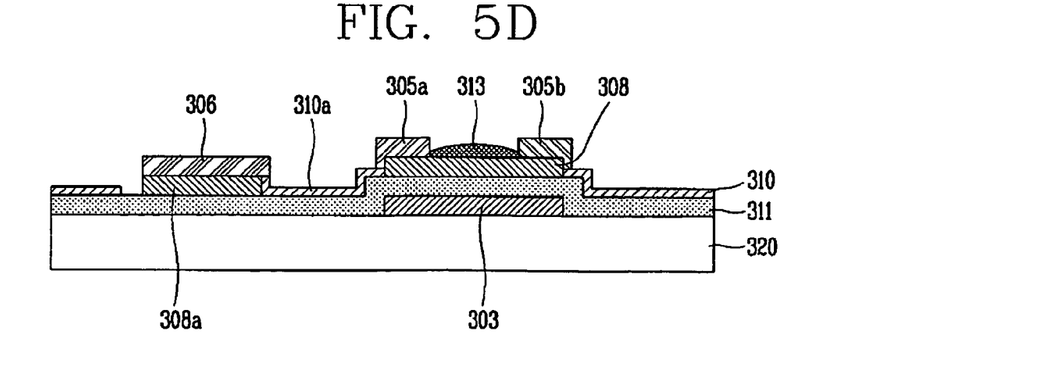
Figure 6A:
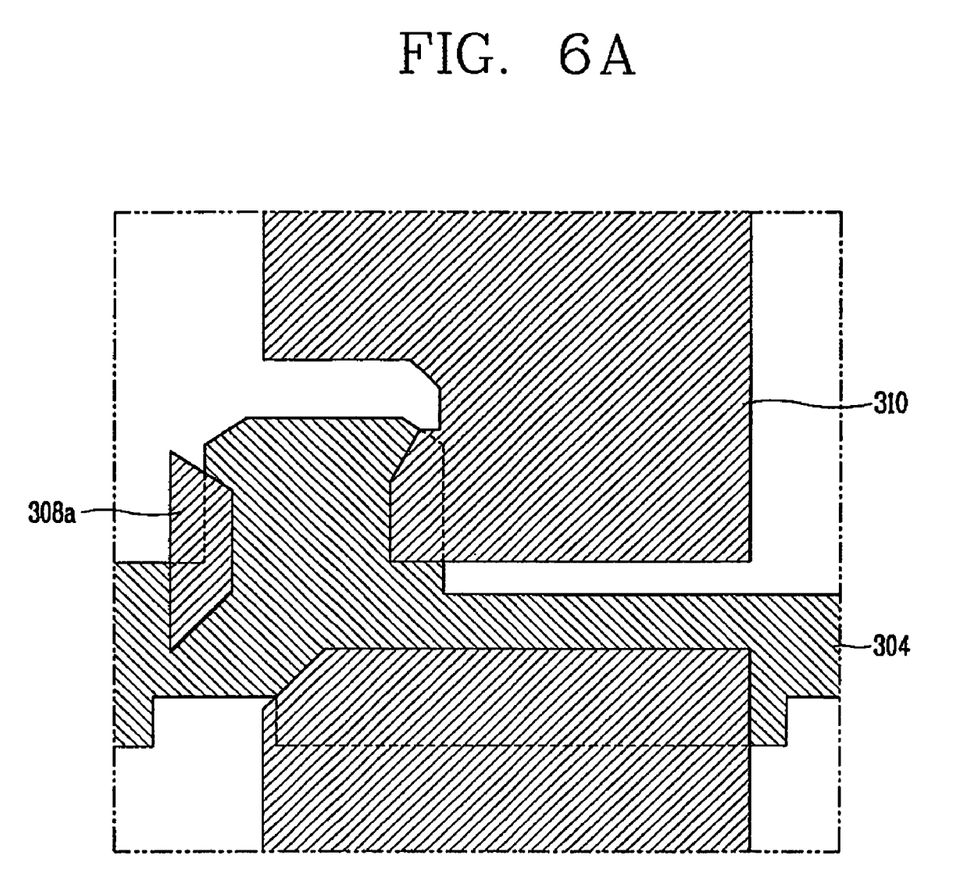
FIGS. 6a to 6c are plan diagrams illustrating the fabrication method of the liquid crystal display device in accordance with the present invention.
Figure 6B:
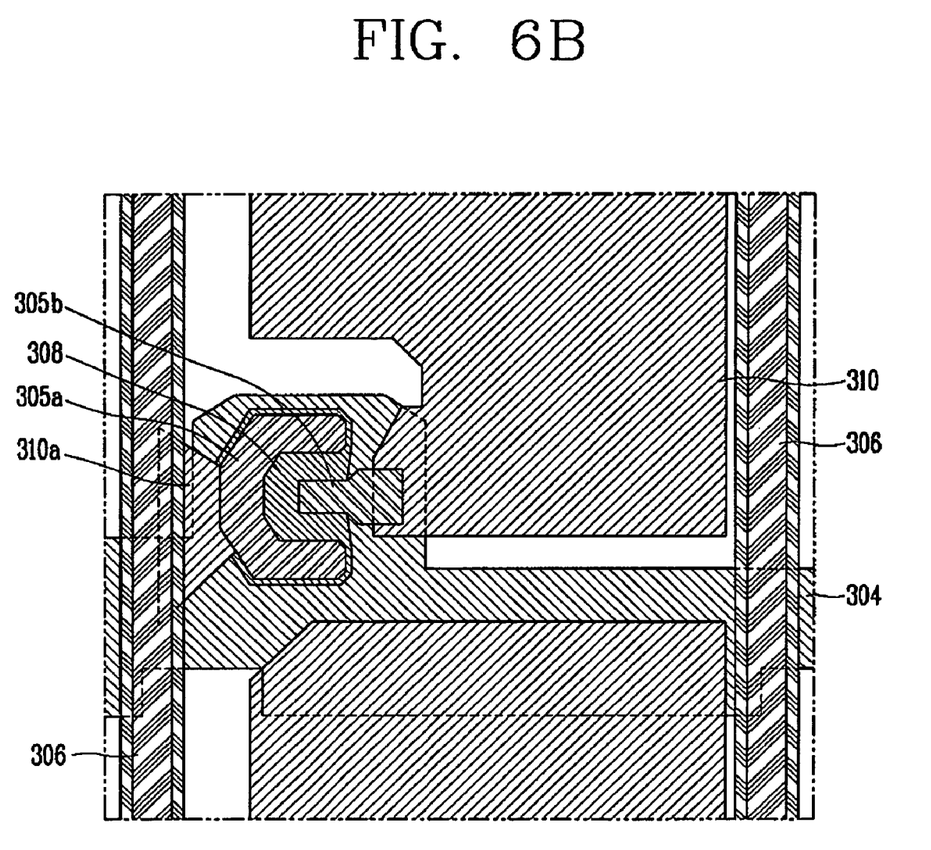
Figure 6C:
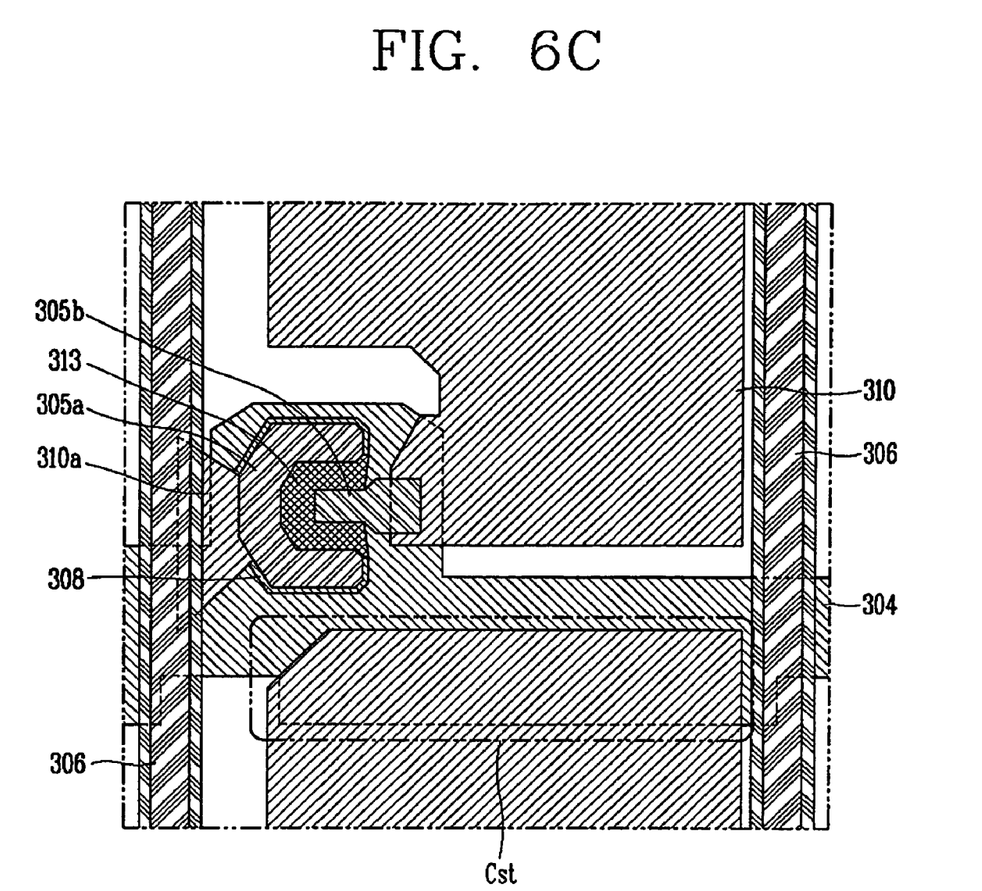

FIGS. 5a to 5d and FIGS. 6a to 6c illustrate the fabrication method of a lower substrate of the liquid crystal display device in accordance with the present invention. FIGS. 5a to 5d are cross-sectional diagrams and FIGS. 6a to 6c are plan diagrams.

As shown in FIGS. 5a and 6a, a transparent lower substrate 320 is prepared, and a gate line 304 and a gate electrode 303 of a TFT extending from the gate line 304 are formed on the lower substrate 320 by a first mask process. A gate insulating film 311 is formed on the whole surface of the lower substrate 320 including the gate electrode 303. A semiconductor pattern 308a and a semiconductor layer 308 of the TFT are formed on the gate insulating film 311 by a second mask process, respectively. Here, the semiconductor pattern 308a is formed for repair of a data line 306 that is formed later. The semiconductor layer 308 is formed in an area that corresponds to the gate electrode 303. A PR pattern 350 used as a mask for forming the semiconductor pattern 308a and the semiconductor layer 308 is not removed.

As illustrated in FIG. 5b, a transparent conductive material such as ITO or IZO is deposited on the whole surface of the lower substrate 320 including the PR pattern, and the PR pattern 350 is removed. Accordingly, as shown in FIG. 5c, a pixel electrode 310 is formed in a pixel region P, and a connecting pattern 310a is formed to connect the semiconductor pattern 308a to the semiconductor layer 308 of the TFT.

Referring to FIGS. 5d and 6b, a data line 306 vertically crossing the gate line 304 and partially contacting one side of the connecting pattern 310a, a source electrode 305a on the semiconductor layer 308 with a predetermined gap from the data line 306 and having its one side connected to the other side of the connecting pattern 310a to be electrically connected to the data line 306, and a drain electrode 305b on the semiconductor layer 308 with a predetermined gap from the source electrode 305a and having its one side contact part of the pixel electrode 310 are formed by a third mask process.

As shown in FIGS. 5d and 6c, a passivation layer 313 made of $SiO_x$ is formed by $O_2$ plasma process on the semiconductor layer 308 exposed between the source electrode 305a and the drain electrode 305b. The semiconductor layer 308 is made of a-Si. When $O_2$ plasma is processed on the surface of a-Si, $SiO_x$ is formed thereon.

The fabrication method of the liquid crystal display device using the 3-mask process simplifies the whole process and cuts down the process cost by omitting the high-priced diffraction mask.

As discussed earlier, the present invention provides a liquid crystal display device capable of preventing a leakage current by the backlight, and the fabrication method thereof. That is, the semiconductor patterns formed at the lower portions of the data lines and the semiconductor layers of the TFTs are isolated from each other, thereby removing the semiconductor patterns exposed to light of the backlight. Therefore, the source electrodes of the TFTs are separated from the data lines by a predetermined gap and electrically connected to the data lines by the connecting patterns formed with the pixel electrodes.

As a result, the semiconductor patterns exposed to light from the backlight are removed to prevent generation of the leakage current. Thus, image quality of the liquid crystal display device may be remarkably improved by preventing generation of the leakage current.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
    a substrate;
    a plurality of gate lines and data lines aligned substantially perpendicularly to each other on the substrate to define a plurality of pixel regions;
    a thin film transistor disposed at each pixel region, each thin film transistor including:
        a gate electrode on the substrate;
        a gate insulating film over the substrate;
        a semiconductor layer disposed on the gate insulating film under which the gate electrode is disposed and in an area along all of the data lines; and
        a source electrode and a drain electrode on the semiconductor layer, the source electrode being separated from a data line of the plurality of data lines by a predetermined gap;
    a pixel electrode on the gate insulating film in each pixel region, the pixel electrode being electrically contacted to side surface of the drain electrode;
    a connecting pattern on the gate insulating film in each pixel region, the connecting pattern being contacted with the source electrode and the bottom surface of the data line to connect electrically the source electrode to a portion of the data line facing the source electrode; and
    a passivation layer on the semiconductor layer at an area between the source electrode and the drain electrode over the gate electrode,
    wherein the pixel electrode and the connecting pattern are directly contacted with an upper surface of the gate insulating layer.

2. The liquid crystal display device of claim 1, wherein the gate insulating film is between the gate electrode and the semiconductor layer.

3. The liquid crystal display device of claim 1, wherein the source electrode is in a U shape.

* * * * *